(12) United States Patent
Nakayama et al.

(10) Patent No.: US 12,429,795 B2
(45) Date of Patent: Sep. 30, 2025

(54) DETECTION APPARATUS, LITHOGRAPHY APPARATUS, AND ARTICLE MANUFACTURING METHOD

(71) Applicant: CANON KABUSHIKI KAISHA, Tokyo (JP)

(72) Inventors: Ryo Nakayama, Tochigi (JP); Takahiro Matsumoto, Tochigi (JP); Takafumi Miyaharu, Tochigi (JP); Hironobu Fujishima, Saitama (JP); Yuichi Fujita, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 238 days.

(21) Appl. No.: 18/317,260

(22) Filed: May 15, 2023

(65) Prior Publication Data

US 2023/0375956 A1 Nov. 23, 2023

(30) Foreign Application Priority Data

May 18, 2022 (JP) ................................ 2022-081722

(51) Int. Cl.
*G03G 15/04* (2006.01)
*G01B 11/25* (2006.01)
*G03G 15/043* (2006.01)
*G03G 15/16* (2006.01)

(52) U.S. Cl.
CPC ..... *G03G 15/04036* (2013.01); *G01B 11/254* (2013.01); *G03G 15/04018* (2013.01); *G03G 15/0435* (2013.01); *G03G 15/1605* (2013.01)

(58) Field of Classification Search
CPC ... G01B 11/254; G03F 7/0002; G03F 9/7042; G03F 9/7049; G03G 15/04018; G03G 15/04036; G03G 15/0435; G03G 15/1605
See application file for complete search history.

(56) References Cited

U.S. PATENT DOCUMENTS

| | | | |
|---|---|---|---|
| 6,204,964 B1 | 3/2001 | Yonezawa et al. | |
| 11,537,056 B2 | 12/2022 | Komaki et al. | |
| 2005/0190376 A1* | 9/2005 | Wegmann | G03F 7/706 356/509 |
| 2007/0247984 A1* | 10/2007 | Ophey | G11B 7/1353 |

(Continued)

FOREIGN PATENT DOCUMENTS

| | | |
|---|---|---|
| JP | 2021004940 A | 1/2021 |
| KR | 1020210000678 A | 1/2021 |

*Primary Examiner* — Deoram Persaud
(74) *Attorney, Agent, or Firm* — ROSSI, KIMMS & McDOWELL LLP

(57) ABSTRACT

A detection apparatus includes an image sensing device having an image sensing plane including a first periodic structure; and an optical system configured to illuminate a detection target including a second periodic structure different from the first periodic structure, and form an image of light from the detection target on the image sensing plane. Light having entered the image sensing plane generates a plurality of diffracted light beams of different orders in accordance with the first periodic structure. A normal of the image sensing plane is tilted with respect to an optical axis of the optical system such that the optical axis is located between diffracted light beams of adjacent orders not less than a first order among the plurality of diffracted light beams.

14 Claims, 7 Drawing Sheets

(56) References Cited

U.S. PATENT DOCUMENTS

| | | | | |
|---|---|---|---|---|
| 2008/0192224 A1* | 8/2008 | Gruner | ................ | G03F 7/70191 |
| | | | | 355/71 |
| 2009/0170042 A1* | 7/2009 | Kanda | ................... | G03B 27/54 |
| | | | | 355/70 |
| 2009/0279081 A1* | 11/2009 | Urano | ................ | G01N 21/9501 |
| | | | | 356/237.5 |
| 2010/0157266 A1* | 6/2010 | Zimmermann | ..... | G03F 7/70333 |
| | | | | 355/53 |
| 2018/0259863 A1* | 9/2018 | Komaki | .................. | G01D 5/28 |
| 2020/0174383 A1* | 6/2020 | Povazay | ................. | G03F 7/706 |
| 2020/0409277 A1* | 12/2020 | Komaki | ............... | G03F 9/7042 |
| 2021/0191282 A1* | 6/2021 | Liu | ........................... | B81B 1/00 |
| 2022/0236650 A1* | 7/2022 | Nakayama | ............ | G03F 9/7065 |
| 2022/0357674 A1* | 11/2022 | Hill | ........................ | G01B 11/26 |
| 2023/0324809 A1* | 10/2023 | Uziel | ................ | G03F 7/706831 |

\* cited by examiner

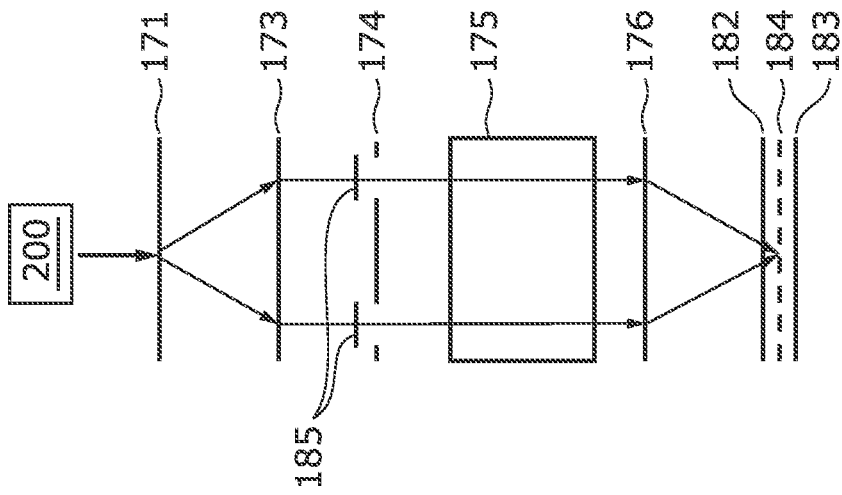
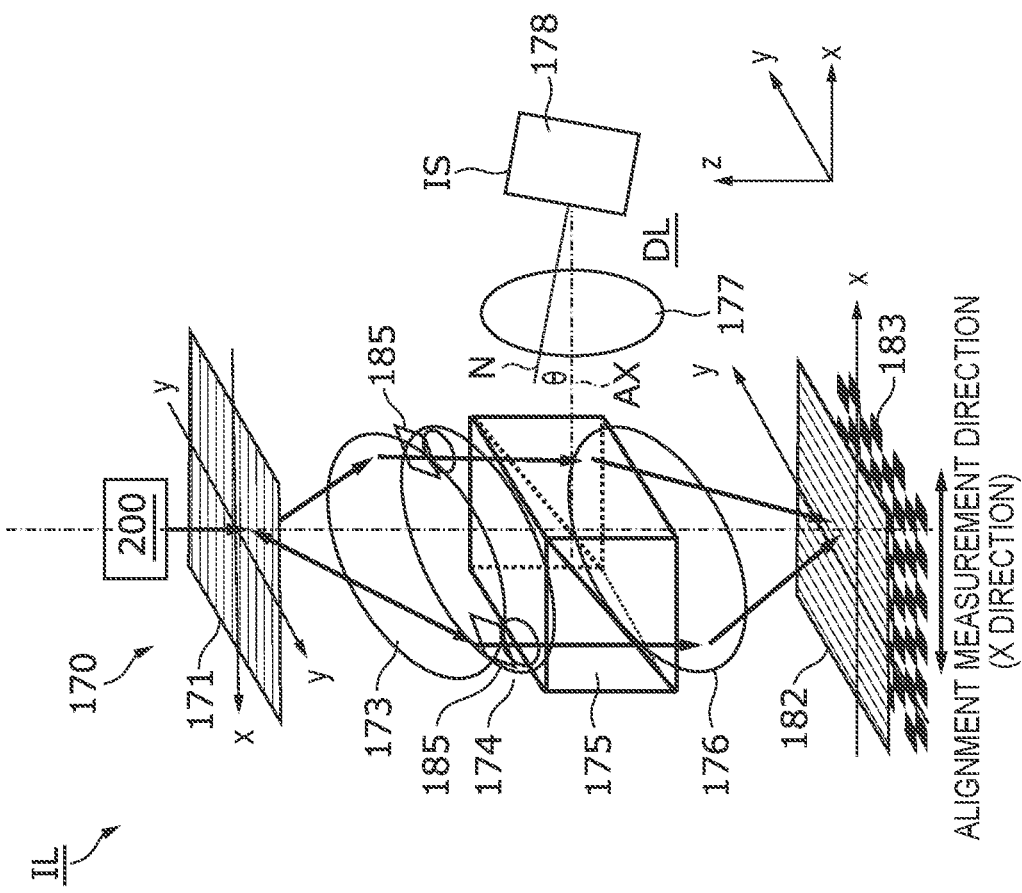

DETECTION APPARATUS, LITHOGRAPHY APPARATUS, AND ARTICLE MANUFACTURING METHOD

BACKGROUND OF THE INVENTION

Field of the Invention

The present invention relates to a detection apparatus, a lithography apparatus, and an article manufacturing method.

Description of the Related Art

Japanese Patent Laid-Open No. 2021-004940 describes that an image sensing device senses a moire fringe generated by a mold mark provided on a mold and a substrate mark provided on a substrate, and the relative position between the mold mark and the substrate mark is obtained based on the image of the moire fringe.

The image sensing device includes a pixel array formed by a periodic array of a plurality of pixels. Therefore, the image sensing plane of the image sensing device has a periodic structure. The periodic structure generates diffracted light, and the diffracted light causes noise components in the image sensed by the image sensing device. The noise components can deteriorate the detection accuracy of a detection apparatus.

SUMMARY OF THE INVENTION

The present invention provides a technique advantageous in suppressing a deterioration in detection accuracy caused by the periodic structure of an image sensing device.

One of aspects of the present invention provides a detection apparatus comprising: an image sensing device having an image sensing plane including a first periodic structure; and an optical system configured to illuminate a detection target including a second periodic structure different from the first periodic structure, and form an image of light from the detection target on the image sensing plane, wherein light having entered the image sensing plane generates a plurality of diffracted light beams of different orders in accordance with the first periodic structure, and wherein a normal of the image sensing plane is tilted with respect to an optical axis of the optical system such that the optical axis is located between diffracted light beams of adjacent orders not less than a first order among the plurality of diffracted light beams.

Further features of the present invention will become apparent from the following description of exemplary embodiments with reference to the attached drawings.

BRIEF DESCRIPTION OF THE DRAWINGS

FIGS. 2A and 2B are views exemplarily showing the arrangement of a detection apparatus according to the first embodiment;

DESCRIPTION OF THE EMBODIMENTS

Figure 1:
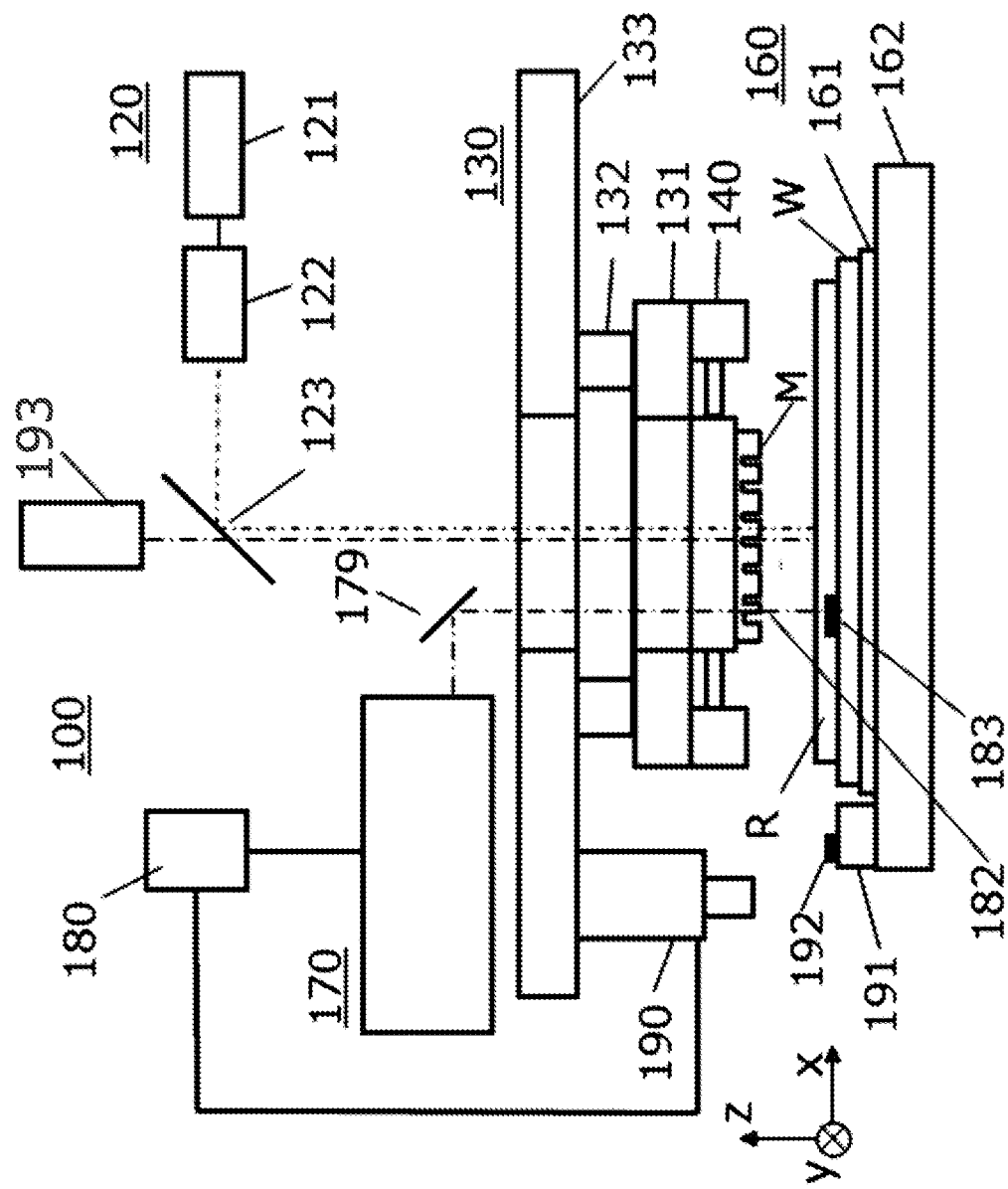
FIG. 1 is a view exemplarily showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

One aspect of the present invention relates to a detection apparatus that includes an image sensing device having an image sensing plane including a first periodic structure, and an optical system configured to illuminate a detection target including a second periodic structure different from the first periodic structure, and form an image of light from the detection target on the image sensing plane. The second periodic structure of the detection target can be formed by, for example, a first pattern provided on a first object and a second pattern provided on a second object arranged so as to overlap the first object. The first pattern and the second pattern can generate a moire fringe corresponding to relative positions of the first pattern and the second pattern. Alternatively, the second periodic structure of the detection target may be formed by an alignment mark provided on an object.

Another aspect of the present invention relates to a lithography apparatus that transfers a pattern of an original onto a substrate. The lithography apparatus can include the above-described detection apparatus provided for alignment between the original and the substrate, and a control unit configured to control the alignment between the original and the substrate based on an output of the detection apparatus. The lithography apparatus may be, for example, an imprint apparatus, an exposure apparatus, or a drawing apparatus such as an electron beam drawing apparatus. In the following description, an imprint apparatus and a detection apparatus that can be incorporated in the imprint apparatus will be exemplarily described as an application example of the present invention.

The imprint apparatus can be configured to bring an imprint material arranged on a substrate and a mold (original) into contact with each other, and cure the imprint material by applying curing energy to the imprint material, thereby forming, on the substrate, a pattern formed of a cured product of the imprint material.

As an imprint material, a curable composition (to be also referred to as a resin in an uncured-state) that is cured by receiving curing energy is used. Examples of the curing energy are an electromagnetic wave, heat, and the like. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged, by an imprint material supply apparatus (not shown), on the substrate in the form of droplets or in the form of an island or film formed by connecting a plurality of droplets. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

FIG. 1 exemplarily shows the arrangement of an imprint apparatus 100 according to an embodiment. In the specification and the drawings, directions will be indicated by an xyz coordinate system in which the horizontal surface is set as the x-y plane. In general, a substrate W such as a wafer is placed on a substrate stage 162 such that the surface of the substrate W is parallel to the horizontal surface (x-y plane). Therefore, in the specification and the drawings, the directions orthogonal to each other in a plane along the surface of the substrate W are the x-axis and the y-axis, and the direction perpendicular to the x-axis and the y-axis is the z-axis. Further, directions parallel to the x-axis, the y-axis, and the z-axis of the xyz coordinate system are referred to as the x direction, the y direction, and the z direction, respectively, and a rotational direction around the x-axis, a rotational direction around the y-axis, and a rotational direction around the z-axis are referred to as the θx direction, the θy direction, and the θz direction, respectively.

In an example, the imprint apparatus 100 is a UV photo-curing imprint apparatus that cures an imprint material by irradiation of UV light (ultraviolet light). However, the imprint apparatus 100 may be an imprint apparatus that cures the imprint material by irradiation of light of another wavelength range, or may be an imprint apparatus that cures the imprint material by another energy (for example, heat).

The imprint apparatus 100 can be configured to form a pattern in each of a plurality of shot regions on the substrate W by repeating an imprint process. The imprint process can be a process of forming the pattern in one shot region on the substrate W by curing an imprint material R in a state in which the pattern region of a mold M is in contact with the imprint material R arranged on the substrate W.

The imprint apparatus 100 can include, for example, a curing unit 120, a mold operation mechanism 130, a mold shape correction mechanism 140, a substrate driving unit 160, a detection apparatus 170, a supply unit 190, an observation scope 193, and a control unit 180. Although not shown, the imprint apparatus 100 can include a bridge plate that supports the mold operation mechanism 130, a base plate that supports the substrate driving unit 160, and the like.

The curing unit 120 can cure the imprint material R by irradiating the imprint material R on the substrate W with ultraviolet light via the mold M. In this case, the imprint material R can be a UV curing resin. The curing unit 120 can include, for example, a light source unit 121, an optical system 122, and a half mirror 123. The light source unit 121 can include, for example, a light source such as a mercury lamp that generates ultraviolet light (for example, i-line or g-line), and an ellipse mirror that condenses light generated by the light source.

The optical system 122 can include, for example, a lens, an aperture, and the like that are used to apply the light for curing the imprint material R to the imprint material R on the shot region. The light having passed through the optical system 122 can be reflected by the half mirror 123 and applied to the imprint material R. The aperture is used to control the angle of view and control peripheral light shielding. Controlling the angle of view enables illumination of only a target shot region. Controlling peripheral light shielding enables restriction of irradiation of the ultraviolet light beyond the target shot region. The optical system 122 may include an optical integrator to evenly illuminate the mold M. The light whose range is defined by the aperture strikes the imprint material R on the substrate W via the optical system 122 and the mold M. In the pattern region of the mold M, for example, a pattern such as a circuit pattern or the like of a device has been formed. The material of the mold M is, for example, quartz or the like that can transmit ultraviolet light.

The mold operation mechanism 130 can include, for example, a mold chuck 131 that holds the mold M, a mold driving mechanism 132 that drives the mold M by driving the mold chuck 131, and a mold base 133 that supports the mold driving mechanism 132. The mold driving mechanism 132 can include a positioning mechanism that controls the position of the mold M with respect to six axes, and a mechanism that brings the mold M into contact with the imprint material R on the substrate W and separates the mold M from the cured imprint material R. The six axes are the x, y, z, θx, θy, and θz directions.

The mold shape correction mechanism 140 can be mounted on the mold chuck 131. The mold shape correction mechanism 140 can correct the shape of the mold M (pattern region thereof) by, for example, applying a pressure to the outer peripheral side surface of the mold M using a cylinder operated by a fluid such as air or oil or an actuator such as a piezo element. Alternatively, the mold shape correction mechanism 140 includes a temperature control unit that controls the temperature of the mold M, and can correct the shape of the mold M (pattern region thereof) by controlling the temperature of the mold M. The substrate W can deform (typically, expand or contract) via a process such as annealing. In accordance with such deformation of the substrate W, the mold shape correction mechanism 140 can correct the shape of the mold M such that the overlay error between the pattern of the mold M and the existing pattern on the substrate W falls within an allowable range.

The substrate driving unit 160 can include, for example, a substrate chuck 161, the substrate stage 162, a reference mark table 191, and a stage driving mechanism (not shown). The substrate chuck 161 can hold the substrate W by suction. The substrate stage 162 supports the substrate chuck 161, and moves the substrate W by driving the substrate chuck 161. A reference mark 192 is arranged on the reference mark table 191. The stage driving mechanism (not shown) can include a positioning mechanism that controls the position of the substrate W by controlling the position of the substrate stage 162 with respect to the above-described six axes.

The detection apparatus 170 can be formed as an apparatus configured to detect the relative position (position deviation) between the mold M and the shot region on the substrate W. In another point of view, the detection apparatus 170 can be formed as an apparatus configured to detect the relative position (position deviation) between an alignment mark provided on the mold M and an alignment mark provided in the shot region on the substrate W. The detection apparatus 170 can be configured to, for example, illuminate an alignment mark 182 provided on the mold M and an alignment mark 183 provided on the substrate W, and sense (detect) the interference fringe (moire fringe) formed by light diffracted by the two alignment marks. The control unit 180 can detect the relative positions of the two alignment marks based on the image sensed by the detection apparatus 170. This function of the control unit 180 may be incorporated in the detection apparatus 170. The detection apparatus 170 may be used to detect at least one of the position of the mark provided on the mold M and the position of the mark provided in the shot region on the substrate W.

The supply unit 190 can be formed as a dispenser that supplies the imprint material R onto the substrate W. The supply unit 190 can include a tank that stores the imprint material R, nozzles that discharge, onto the substrate W, the imprint material R supplied from the tank via a supply path, a valve provided in the supply path, and a supply amount control unit.

The observation scope 193 is a scope for observing the shot region, and includes an image sensing device that senses the shot region. The observation scope 193 can be used to, for example, check the contact state between the mold M and the imprint material R and the progress of filling of the imprint material R into the concave portion of the pattern provided in the pattern region of the mold M.

The imprint process performed by the imprint apparatus 100 will be described. First, under the control of the control unit 180, a substrate conveyance apparatus (not shown) conveys the substrate W onto the substrate chuck 161, and the substrate W is fixed on the substrate chuck 161. Then, under the control of the control unit 180, the stage driving mechanism moves the substrate stage 162 such that the shot region is located immediately below the mold M. Then, under the control of the control unit 180, the mold driving mechanism 132 lowers the mold M to bring the mold M into contact with the imprint material R on the substrate W (contact step). When the mold M comes into contact with the imprint material R, the imprint material R flows along the surface of the pattern region of the mold M, and is filled into a space between the pattern region and the substrate W and the concave portion of the pattern provided in the pattern region. In addition, in a state in which the mold M and the imprint material R are in contact with each other, the detection apparatus 170 can detect (sense) the image formed by reflected diffracted light from the alignment mark 182 on the mold M and the alignment mark 183 on the substrate W. Based on the output (image) of the detection apparatus 170, the control unit 180 can perform alignment between the mold M and the substrate W by driving the substrate stage 162, shape correction of the pattern region of the mold M by the mold shape correction mechanism 140, and the like. Thereafter, under the control of the control unit 180, the curing unit 120 applies ultraviolet light from the back surface (upper surface) of the mold M, and cures the imprint material R by the ultraviolet light transmitted through the mold M (curing step). Subsequently, under the control of the control unit 180, the mold driving mechanism 132 drives the mold M upward to separate the mold M from the cured imprint material R (mold separation step). Thus, the pattern of the mold M is transferred to the imprint material R on the substrate W.

FIG. 2A is a perspective view showing the arrangement of the detection apparatus 170 according to the first embodiment, and FIG. 2B is a y-z sectional view of the detection apparatus 170 shown in FIG. 2A. In order to simplify the description of the optical system, FIG. 2A shows only the optical system that performs measurement in a single direction (for example, x direction). In FIG. 1, the direction of the light emitted from the detection apparatus 170 is changed by a mirror 179 and the light then illuminates the alignment marks 182 and 183. However, for the sake of descriptive convenience, the mirror 179 is not shown in FIGS. 2A and 2B.

The detection apparatus 170 can include a light source 200, an illumination optical system IL, and a detection optical system DL. The illumination optical system IL can be configured to, for example, illuminate the alignment mark 182 arranged on the mold M and the alignment mark 183 arranged on the substrate W. In this example, the alignment marks 182 and 183 serve as detection targets. The detection target serves as a target of relative position detection or position detection in addition to a target of image sensing. The illumination optical system IL can be configured to perform dipole illumination in which the detection target is illuminated with illumination light including two poles in the pupil plane of the illumination optical system IL. For example, the illumination optical system IL can include a diffraction optical element 171, a lens 173, an aperture stop 174 including two openings for implementing dipole illumination, two polarization elements 185, and a beam splitter 175. The diffraction optical element 171 can diffract light from the light source 200 toward the two openings of the aperture stop 174. The two polarization elements 185 can be provided so as to correspond to the two openings of the aperture stop 174, respectively, and arranged such that the polarization directions of light beams from the two polarization elements are orthogonal to each other. For example, when polarizers are used as the polarization elements, they can be arranged such that the transmission axes of the polarizers are orthogonal to each other. The detection optical system DL can include, for example, a lens 176, the beam splitter 175, a lens 177, and an image sensing device 178.

Figure 3A:
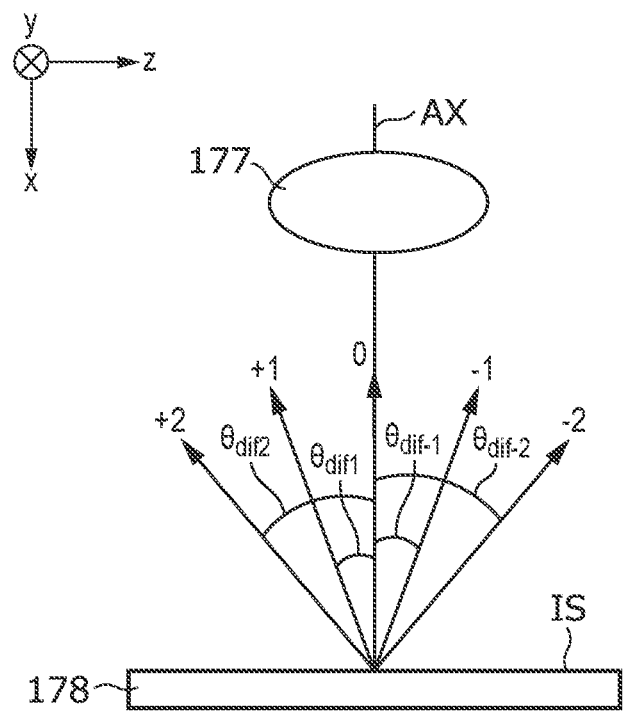
FIGS. 3A and 3B are views for explaining reflected diffracted light beams from an image sensing device having an image sensing plane including a periodic structure.
Figure 3B:
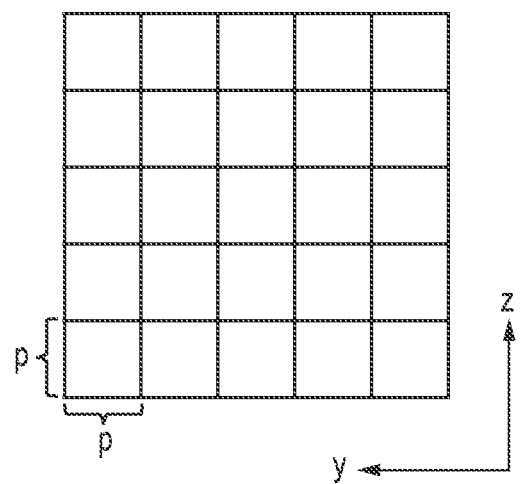

As schematically shown in FIG. 3B, the image sensing device 178 has an image sensing plane IS including a first periodic structure. The first periodic structure can be inevitably formed by, for example, a microlens array, a light shielding film, or the like. In the example shown in FIG. 3B, the first periodic structure has a period (pitch) p in each of the x direction and the y direction. The illumination optical system IL and the imaging optical system DL form an optical system configured to illuminate a detection target and form the image of light from the detection target on the image sensing plane IS of the image sensing device 178. The detection target can include a second periodic structure different from the first periodic structure. In this example, the second periodic structure of the detection target is formed by the alignment mark 183 (first pattern) provided on the substrate W and the alignment mark 182 (second pattern) provided on the mold M arranged so as to overlap the alignment mark 183. The substrate W is an example of the first object, and the mold M is an example of the second object. The alignment mark 183 can include a periodic structure different from the first periodic structure, and the alignment mark 182 can also include a periodic structure different from the first periodic structure.

Light having entered the image sensing plane IS of the image sensing device 178 generates a plurality of diffracted light beams of different orders in accordance with the first periodic structure of the image sensing plane IS. A normal N of the image sensing plane IS is tilted by a tilt angle θ with respect to an optical axis AX of the optical system (here, it is only required to pay attention to the detection optical system DL) such that the optical axis AX is located between the diffracted light beams of adjacent orders among the plurality of diffracted light beams. In an example, the tilt angle θ of the normal N of the image sensing plane IS with respect to the optical axis AX is the angle between the optical axis AX and the normal N of the image sensing plane IS in the x-z plane.

Figure 4A:
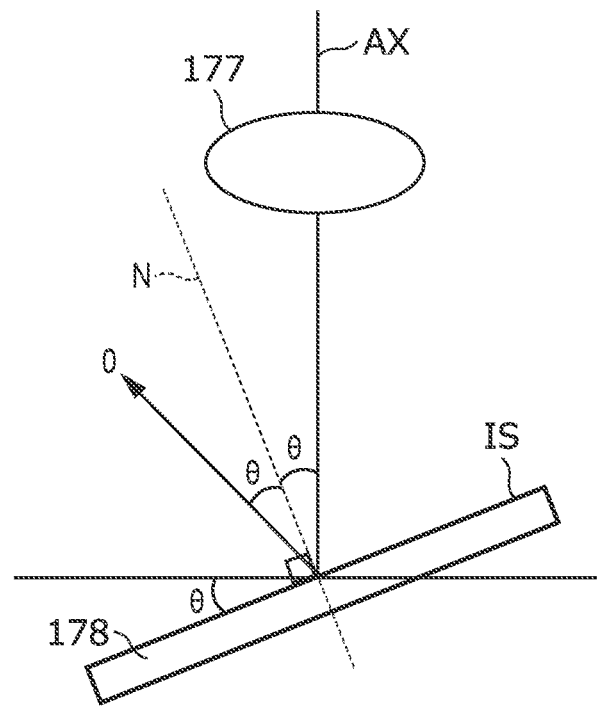
FIGS. 4A and 4B are views for explaining the reflected diffracted light beams from the image sensing device in a case of tilting the image sensing device.
Figure 4B:
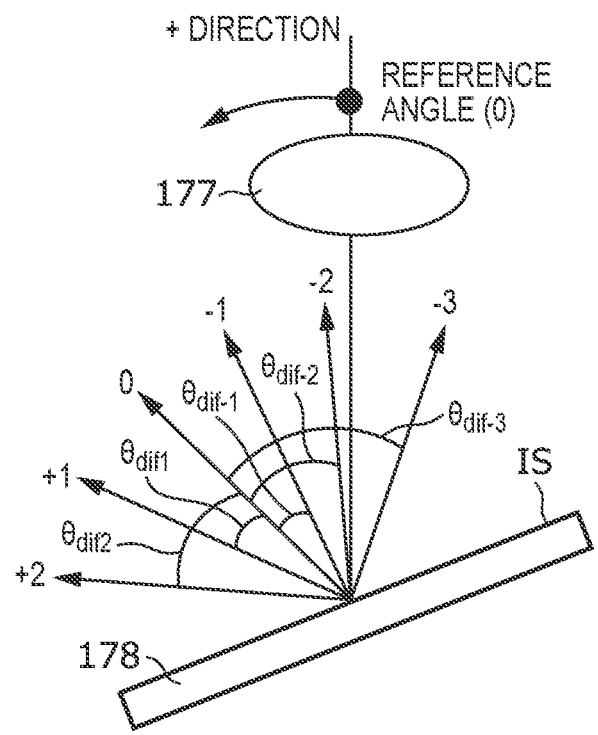

A method of deciding the tilt angle θ will be described below in detail. FIG. 3A is a schematic enlarged view of a portion of the detection optical system DL including the lens 177 and the image sensing device 178 in a case of the tilt angle θ=0. As schematically shown in FIG. 3B, the image sensing plane IS of the image sensing device 178 includes the first periodic structure. As schematically shown in FIG. 3A, the light having entered the image sensing plane IS of the image sensing device 178 via the lens 177 generates the plurality of diffracted light beams of different orders in accordance with the first periodic structure. Some of these diffracted light beams return to the detection optical system DL, and can generate an interference fringe and/or flare. Letting λ, be the wavelength of the illumination light generated by the light source 200 and p be the period (pitch) of the first periodic structure, a diffraction angle θdifn of the nth-order diffracted light beam is expressed as:

$$\theta_{difn} = \sin^{-1}\left(\frac{n\lambda}{p}\right) \quad (1)$$

where n is an integer, and can include a negative value. In FIG. 3A, the counterclockwise direction is defined as the positive direction, but the generality is not lost even if the clockwise direction is defined as the positive direction. Since the diffracted light beams as described above are added to the image (moire fringe) as the image sensing target of the image sensing device 178, the detection accuracy of the relative positions of the alignment marks 183 and 182, that is, the alignment measurement accuracy can be deteriorated. Therefore, the tilt angle θ is decided so as to prevent the diffracted light beams from returning from the image sensing plane IS to the detection optical system DL. FIG. 4A shows the 0th-order diffracted light beam in a case in which the tilt angle θ is larger than 0. FIG. 4B shows diffracted light beams of multiple orders. The travel direction of the −nth-order diffracted light beam is expressed by:

$$2\theta - \sin^{-1}\left(\frac{n\lambda}{p}\right) \quad (2)$$

In order to prevent the diffracted light beams diffracted by the image sensing plane IS from returning to the detection optical system DL, the tilt angle θ is decided such that the optical axis AX of the detection optical system DL is located between the diffracted light beams of adjacent orders (here, the −nth-order diffracted light beam and the −(n+1)th-order diffracted light beam) among the plurality of diffracted light beams. Here, it is preferable that the tilt angle θ is decided such that the bisector between the optical paths of the diffracted light beams of adjacent orders (here, the −nth-order diffracted light beam and the −(n+1)th-order diffracted light beam) overlaps the optical axis AX of the optical system. In other words, it is preferable that the average angle of the diffraction angle of the −nth-order diffracted light beam and the diffraction angle of the −(n+1)th-order diffracted light beam coincides with the tilt angle θ. This can be expressed as:

$$\frac{1}{2}\left\{\left(2\theta - \sin^{-1}\left(\frac{n\lambda}{p}\right)\right) + \left(2\theta - \sin^{-1}\left(\frac{(n+1)\lambda}{p}\right)\right)\right\} = 0 \quad (3)$$

By transforming equation (3), the tilt angle θ is expressed as:

$$\theta = \frac{1}{4}\left(\sin^{-1}\left(\frac{n\lambda}{p}\right) + \sin^{-1}\left(\frac{(n+1)\lambda}{p}\right)\right) \quad (4)$$

Here, as exemplarily shown in FIG. 3B, the image sensing device 178 is typically periodic in two directions orthogonal to each other. Considering this, the normal N of the image sensing plane IS may be tilted with respect to the optical axis AX such that the image sensing device 178 pivots around an axis parallel to the diagonal direction (for example, a direction of 45° with respect to the y-axis and z-axis) in FIG. 3B. In this case, p in formulas (1) to (3) can be replaced with (√2)p.

Further, considering that the image sensing plane IS of the image sensing device 178 has a two-dimensional first periodic structure, the tilt angle θ can be decided as follows. First, it is defined that the first periodic structure includes a first structure having a periodicity in a first direction (for example, y direction) orthogonal to the normal N, and a second structure having a periodicity in a second direction (for example, z direction) orthogonal to the normal N and the first direction. In this case, light that has entered the image sensing plane IS can generate a plurality of first diffracted light beams of different orders in accordance with the first structure, and generate a plurality of second diffracted light beams of different orders in accordance with the second structure. Therefore, the tilt angle θ of the normal N of the image sensing plane IS can be decided such that the optical axis AX of the detection optical system DL is located between first diffracted light beams of adjacent orders among the plurality of first diffracted light beams and between second diffracted light beams of adjacent orders among the plurality of second diffracted light beams.

Further, it is preferable that the diffracted light beams from the image sensing plane IS of the image sensing device 178 do not return within the NA of the detection optical system DL (in other words, the pupil region of the detection optical system DL). In other words, the tilt angle θ of the normal N of the image sensing plane IS with respect to the optical axis AX of the detection optical system DL can be decided such that the diffracted light beams of adjacent orders among the diffracted light beams of multiple orders generated by the image sensing plane IS travel toward the outside of the NA of the imaging optical system DL. The NA of the detection optical system DL can be defined by, for example, an aperture stop (not shown) provided in the detection optical system DL. The aperture stop may be provided in the beam splitter 175, or may be arranged between the beam splitter 175 and the lens 177.

Figure 5C:
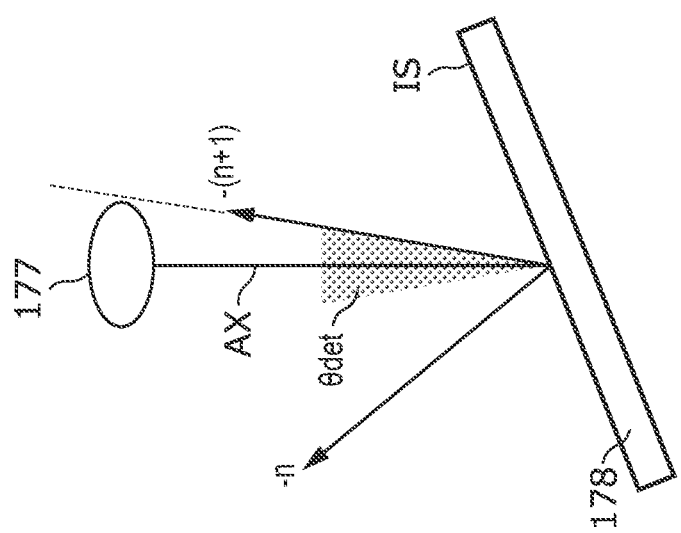
FIGS. 5A to 5C are views for explaining a method of deciding the tilt angle in consideration of the NA of a detection optical system.

The condition for preventing the diffracted light beams generated by the image sensing plane IS from returning within the NA of the imaging optical system DL will be described below with reference to FIGS. 5A to 5C. FIG. 5A shows a state in which the bisector between the −nth-order diffracted light beam and the −(n+1)th-order diffracted light beam is located on the optical axis AX, that is, a state in which equation (4) holds. Letting NAdet be the NA of the detection optical system DL, an angle $\theta_{det}$ corresponding to this is expressed as:

$$\theta_{det} = \sin^{-1}(NA_{det}) \quad (5)$$

Figure 5B:
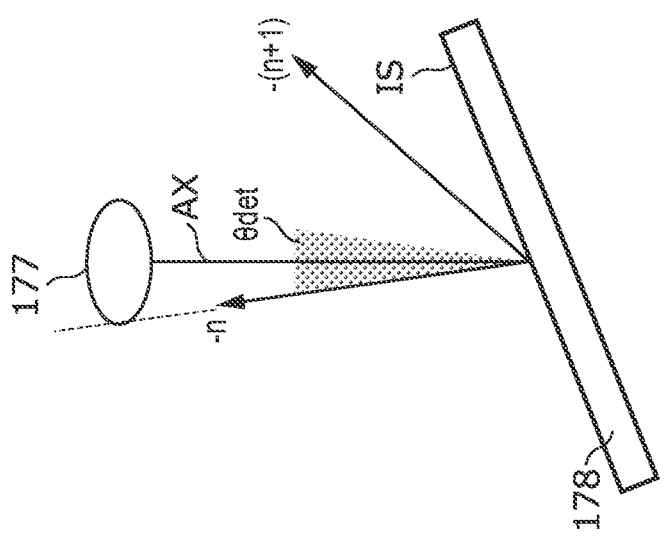
Figure 5A:
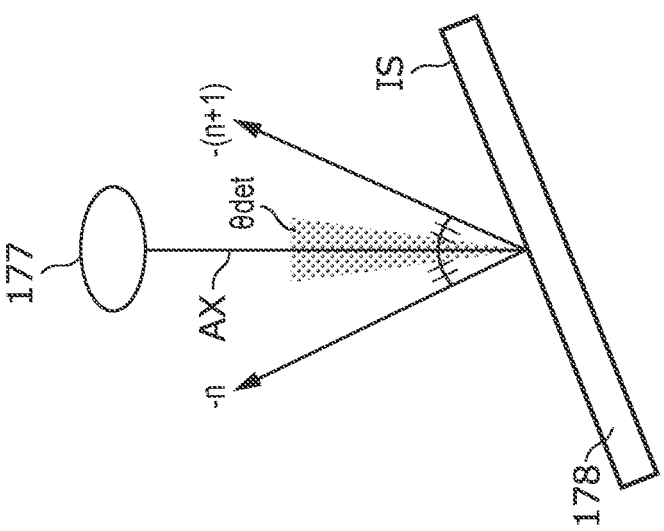

FIG. 5B shows the minimum value of the tilt angle θ that allows the optical axis AX to be located between the −nth-order diffracted light beam and the −(n+1)th-order diffracted light beam and prevents the diffracted light beams from returning within the NA of the detection optical system DL. The tilt angle θ at this time is expressed as:

$$2\theta = \sin^{-1}\left(\frac{n\lambda}{p}\right) + \sin^{-1}(NA_{det}) \quad (6)$$

FIG. 5C shows the maximum value of the tilt angle θ that allows the optical axis AX to be located between the −nth-order diffracted light beam and the −(n+1)th-order diffracted light beam and prevents the diffracted light beams from returning within the NA of the detection optical system DL. The tilt angle θ at this time is expressed as:

$$2\theta = \sin^{-1}\left(\frac{(n+1)\lambda}{p}\right) - \sin^{-1}(NA_{det}) \quad (7)$$

From equation (6) and equation (7), inequality (8) that describes the condition for preventing the diffracted light beams generated by the image sensing plane IS from returning within the NA of the imaging optical system DL can be obtained:

$$\left(\sin^{-1}\left(\frac{n\lambda}{p}\right) + \sin^{-1}(NA_{det})\right) < \theta < \frac{1}{2}\left(\sin^{-1}\left(\frac{(n+1)\lambda}{p}\right) - \sin^{-1}(NA_{det})\right) \quad (8)$$

Light from the light source 200 illuminates the diffraction optical element 171. The diffracted light beams generated by the diffraction optical element 171 pass through the lens 173, the aperture stop 174, the two polarization elements 185, the beam splitter 175, and the lens 176, and perform dipole illumination on the alignment mark 182 on the mold M and the alignment mark 183 on the substrate W. The two polarization elements 185 are arranged such that the polarization directions of light beams emitted from the two poles, respectively, and striking the substrate are orthogonal to each other. The aperture stop 174 is arranged in or near the pupil plane of the illumination optical system IL. The two polarization elements 185 are desirably arranged on the side of the light source with respect to the pupil plane.

The alignment marks 182 and 183 are formed by diffraction gratings that have different pitches in the measurement direction. The alignment mark 183 provided on the substrate W can be formed by a checkerboard grating pattern having a y-direction grating pitch and an x-direction grating pitch. The diffracted light beams from the two alignment marks 182 and 183 generate an interference fringe (moire fringe) having a periodicity in the x direction as the measurement direction. Here, if the relative position between the mold M and the substrate W fluctuates in the x direction, the phase of the interference fringe changes in accordance with the fluctuation of the relative position. The image of the interference fringe is formed on the image sensing plane IS of the image sensing device 178 by the imaging optical system DL formed from the lens 176, the beam splitter 175, and the lens 177, and detected (sensed) by the image sensing device 178. The image sensed by the image sensing device 178 is transmitted to the control unit 180. Based on the phase information in the image of the interference fringe, the control unit 180 calculates the relative position (deviation amount) between alignment mark 182 on the mold M and the alignment mark 183 on the substrate W. Based on the relative position, the control unit 180 controls the mold driving mechanism 132 and the stage driving mechanism that drives the substrate stage 162, thereby performing alignment between the mold M and the substrate W.

In this embodiment, the illumination optical system IL in the detection apparatus 170 is configured to perform dipole illumination by light including two poles in the pupil plane of the illumination optical system IL, and the polarization directions of the light beams emitted from the two poles, respectively, and striking the substrate are orthogonal to each other. The polarization directions of the two light beams formed by the two polarization elements 185 are orthogonal to each other on a detection target. In this embodiment, the two polarization elements 185 are arranged on the side of the light source with respect to the pupil plane, but the arrangement of the two polarization elements 185 is not limited to this as long as the polarization directions are orthogonal to each other on the detection target. For example, the two polarization elements 185 may be arranged on the side of the image plane with respect to the aperture stop 174 configured to implement the dipole illumination. Further, in this embodiment, the optical system illuminates the diffraction optical element, but it is not always necessary to use the diffraction optical element as long as two-beam interference occurs in the optical system. Further, dipole illumination is used in this embodiment, but it is not always necessary to use dipole illumination, and it is also conceivable to use monopole illumination. However, in this case, the defocus state can change due to a change in apparatus environment such as a change in atmospheric pressure. If the defocus state changes, the image may be shifted due to the asymmetric illumination and the performance may be degraded.

A specific example of the tilt angle will be described below. Here, assume a case in which the pitch P of the periodic structure of the microlens array of the image sensing device 178 is 4.8 μm, and the wavelength λ of the illumination light generated by the light source 200 is 760 nm. By calculating equation (4) while substituting the numeric values for the pitch P and the wavelength λ, results shown in Table 1 can be obtained.

TABLE 1

| Optical Axis Position | Tilt Angle θ (degrees) |
| --- | --- |
| Between 0th-order light beam and 1st-order light beam | 2.3 |
| Between 1st-order light beam and 2nd-order light beam | 6.9 |
| Between 2nd-order light beam and 3rd-order light beam | 11.7 |

As exemplarily shown in Table 1, there are a plurality of options for the tilt angle θ. The higher the order, the smaller the influence of the diffracted light beam. On the other hand, if the tilt angle θ is excessively increased, vignetting occurs.

Considering these, the tilt angle θ of the normal N of the image sensing plane IS with respect to the optical axis AX is preferably set to 6.9°.

If the NA of the detection optical system DL is 0.009, $\theta_{dct}$=0.5° according to equation (5). Hence, according to inequality (8), the tilt angle θ considering the NA of the detection optical system DL can be set to an angle larger than 4.8° and smaller than 9.0°. With this, in the arrangement in which the optical axis AX is arranged between the 1st-order diffracted light and the 2nd-order diffracted light from the image sensing plane IS, it is possible to prevent the 1st-order diffracted light and the 2nd-order diffracted light from returning to the detection optical system DL.

Figure 6:
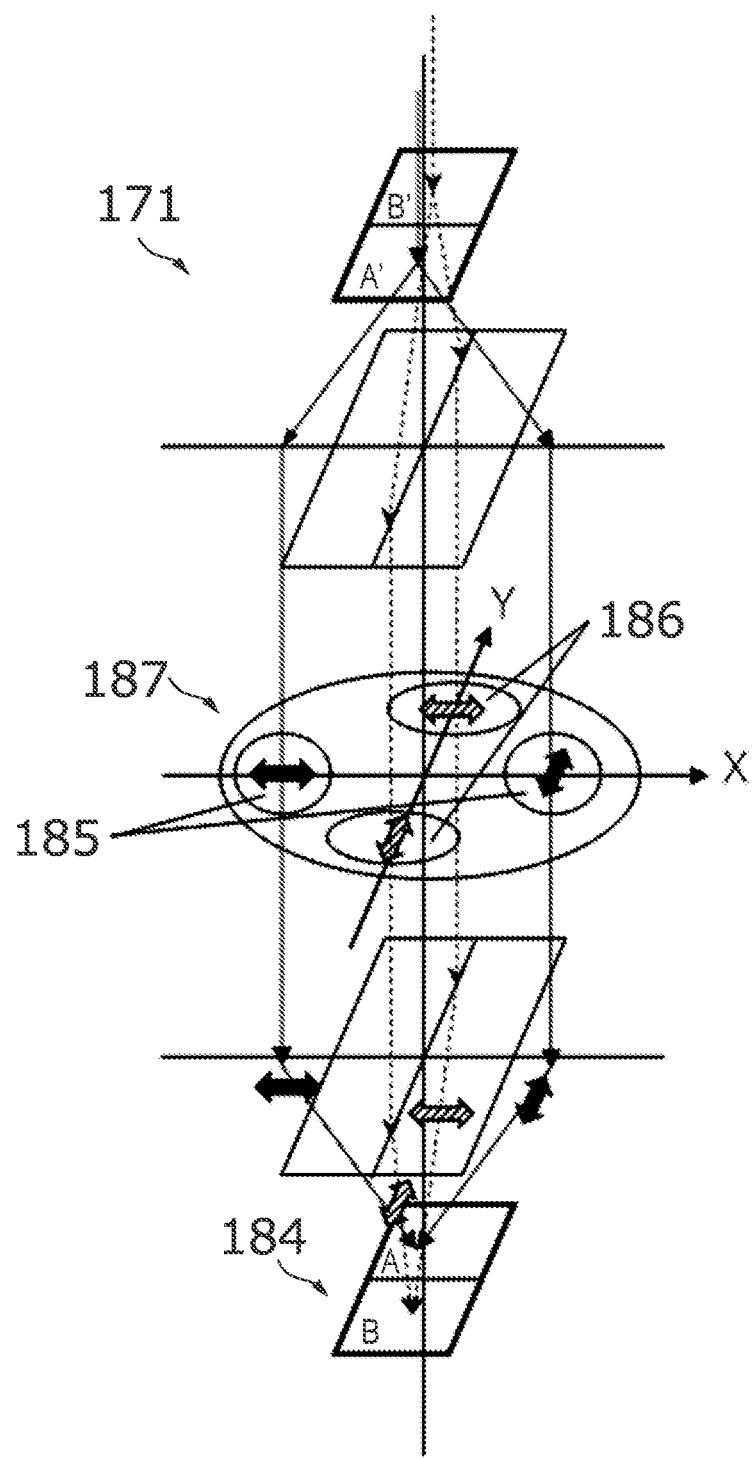
FIG. 6 is a view exemplarily showing the arrangement of a detection apparatus according to the second embodiment.

FIG. 6 exemplarily shows the arrangement of a detection apparatus 170 according to the second embodiment. Matters not mentioned as the second embodiment can follow the first embodiment. In the second embodiment, detection concerning the x direction and detection concerning the y direction can be simultaneously performed. FIG. 6 shows the simplified arrangement of an illumination optical system IL. Components corresponding the lens 173, the aperture stop 174, the lens 176, and the polarization elements 185 in FIG. 2A are not shown in FIG. 6.

A diffraction optical element 171 includes a first region A' that forms illumination light for illuminating a first portion A of a detection target 184, and a second region B' that forms illumination light for illuminating a second portion B different from the first portion A of the detection target 184. The first region A' of the diffraction optical element 171 diffracts light in the X direction in the surface of the diffraction optical element 171. The light diffracted in the X direction passes through polarization elements 185 located in a pupil plane 187. The light beams of the polarization directions in the X and Y directions pass through two poles arranged in the X direction, and illuminate the first portion A of the detection target 184. By evaluating the interference fringe in the first portion A of the detection target 184, it is possible to detect the deviation amount of the relative position between the alignment mark on a mold M and the alignment mark on a substrate W in the Y direction. Similarly, the second region B' of the diffraction optical element 171 diffracts light in the Y direction in the surface of the diffraction optical element 171. The light diffracted in the Y direction passes through polarization elements 186 located in the pupil plane 187. The light beams of the polarization directions in the X and Y directions pass through two poles arranged in the Y direction, and illuminate the second portion B of the detection target 184. By evaluating the interference fringe in the second portion B of the detection target 184, it is possible to detect the deviation amount of the relative position between alignment mark on the mold M and the alignment mark on the substrate W in the X direction.

As has been described above, according to the second embodiment, it is possible to simultaneously perform measurement of the position deviation in the X direction (first direction) and measurement of the position deviation in the Y direction (the second direction intersecting the first direction).

In the first and second embodiments, the second periodic structure of the detection target is formed by the first pattern provided on the first object and the second pattern provided on the second object arranged so as to overlap the first object. However, the second periodic structure of the detection target may be an alignment mark provided on an object (for example, the substrate or the mold). In this case, the position of the alignment mark can be detected.

An article manufacturing method according to an embodiment will be described below. The article manufacturing method according to the embodiment is suitable for manufacturing an article such as a microdevice, for example, a semiconductor device, or an element having a microstructure. The article manufacturing method according to this embodiment includes a step of transferring the pattern of an original onto a substrate by using the above-described lithography apparatus (for example, an imprint apparatus, an exposure apparatus, a drawing apparatus, or the like), and a step of obtaining an article by processing the substrate onto which the pattern has been transferred in the preceding step. The article manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

The pattern of a cured product formed using an imprint apparatus is used permanently for at least some of various kinds of articles or temporarily when manufacturing various kinds of articles. The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 7A:
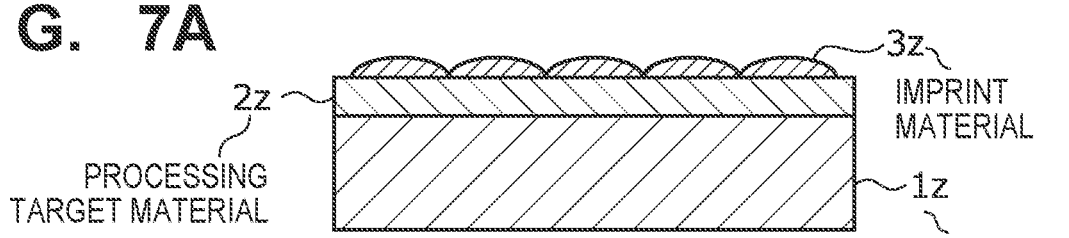
FIGS. 7A to 7F are views exemplarily showing an article manufacturing method.

An article manufacturing method in which an imprint apparatus forms a pattern on a substrate, processes the substrate on which the pattern has been formed, and manufactures an article from the processed substrate will be described next. As shown FIG. 7A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 7B:
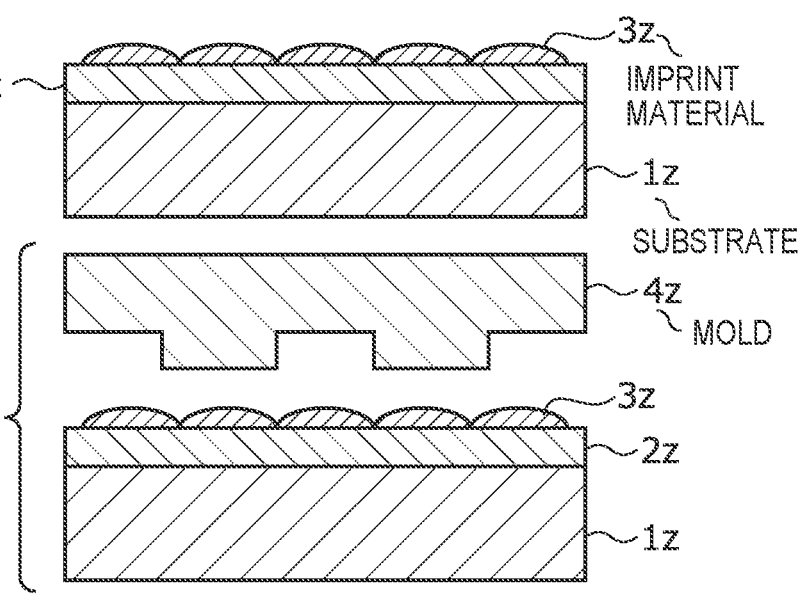
Figure 7C:
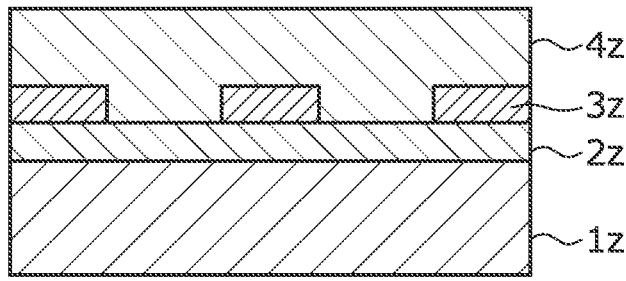

As shown in FIG. 7B, a side of a mold 4z for imprint with a concave-convex pattern is directed toward and made to face the imprint material 3z on the substrate. As shown FIG. 7C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 7D:
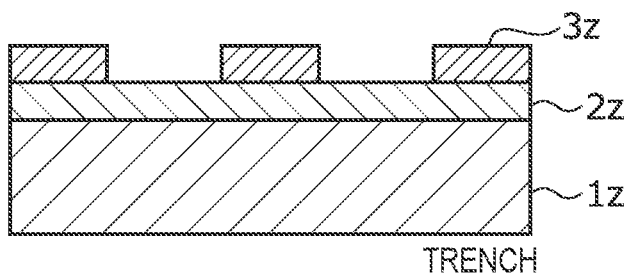

As shown in FIG. 7D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z has been transferred to the imprint material 3z.

Figure 7E:
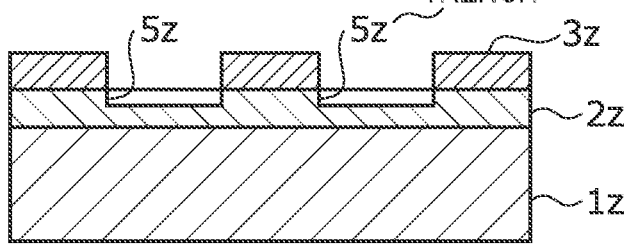
Figure 7F:
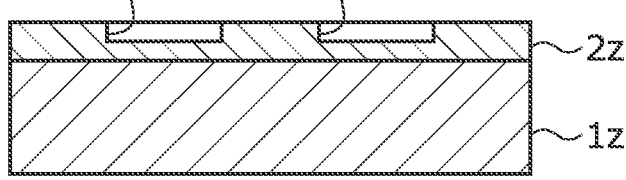

As shown in FIG. 7E, when etching is performed using the pattern of the cured product as an etching resistant mask, a portion of the surface of the processed material 2z where the cured product does not exist or remains thin is removed to form a groove 5z. As shown in FIG. 7F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-081722, filed May 18, 2022, which is hereby incorporated by reference herein in its entirety.

What is claimed is:

1. A detection apparatus comprising:
   an image sensing device having an image sensing plane including a first periodic structure; and
   an optical system configured to illuminate a detection target including a second periodic structure different from the first periodic structure, and form an image of light from the detection target on the image sensing plane,
   wherein light having entered the image sensing plane generates a plurality of diffracted light beams of different orders in accordance with the first periodic structure,
   wherein a normal of the image sensing plane is tilted with respect to an optical axis of the optical system such that the optical axis is located between diffracted light beams of adjacent orders not less than a first order among the plurality of diffracted light beams,
   wherein the optical system includes an illumination optical system configured to illuminate the detection target, and an imaging optical system configured to form the image of light from the detection target on the image sensing plane, and
   wherein the normal of the image sensing plane is tilted with respect to an optical axis of the imaging optical system such that the optical axis of the imaging optical system is located between diffracted light beams of adjacent orders not less than the first order among the plurality of diffracted light beams.

2. The apparatus according to claim 1, wherein
   the normal of the image sensing plane is tilted with respect to the optical axis such that the diffracted light beams of the adjacent orders not less than the first order travel toward an outside of an NA of the imaging optical system.

3. The apparatus according to claim 1, wherein
   the illumination optical system illuminates the detection target with illumination light including two poles.

4. The apparatus according to claim 3, wherein
   the illumination optical system includes
   an aperture stop including two openings, and
   a diffraction optical element configured to diffract light from a light source toward the two openings.

5. The apparatus according to claim 4, wherein
   the illumination optical system further includes two polarization elements provided so as to correspond to the two openings, respectively.

6. The apparatus according to claim 5, wherein
   the two polarization elements are arranged such that polarization directions of light beams from the respective polarization elements are orthogonal to each other.

7. The apparatus according to claim 1, wherein
   the first periodic structure includes a first structure having a periodicity in a first direction orthogonal to the normal, and a second structure having a periodicity in a second direction orthogonal to the normal and the first direction,
   light having entered the image sensing plane generates a plurality of first diffracted light beams of different orders in accordance with the first structure, and generates a plurality of second diffracted light beams of different orders in accordance with the second structure, and
   the normal of the image sensing plane is tilted with respect to the optical axis of the optical system such that the optical axis is located between first diffracted light beams of adjacent orders among the plurality of first diffracted light beams and between second diffracted light beams of adjacent orders among the plurality of second diffracted light beams.

8. The apparatus according to claim 1, wherein
   the normal of the image sensing plane is tilted with respect to the optical axis of the optical system such that a bisector between optical paths of the diffracted light beams of adjacent orders overlaps the optical axis.

9. The apparatus according to claim 1, wherein
   the diffracted light beams of the adjacent orders are a first-order diffracted light beam and a second-order diffracted light beam.

10. A lithography apparatus that transfers a pattern of an original onto a substrate, comprising
    a detection apparatus defined in claim 1 provided for alignment between the original and the substrate; and
    a control unit configured to control the alignment between the original and the substrate based on an output of the detection apparatus.

11. A detection system comprising a detection apparatus defined in claim 1, and a detection target including a second periodic structure,
    wherein the second periodic structure of the detection target is formed by a first pattern provided on a first object and a second pattern provided on a second object arranged so as to overlap the first object.

12. The system according to claim 11, wherein
    the first pattern and the second pattern generate a moire fringe corresponding to relative positions of the first pattern and the second pattern.

13. The system according to claim 11, wherein
    the second periodic structure of the detection target is an alignment mark provided on an object.

14. An article manufacturing method comprising:
    transferring a pattern of an original onto a substrate using a lithography apparatus; and
    obtaining an article from the substrate onto which the pattern has been transferred,
    wherein the lithography apparatus is configured to transfer a pattern of an original onto a substrate, and comprises a detection apparatus provided for alignment between the original and the substrate, and a control unit configured to control the alignment between the original and the substrate based on an output of the detection apparatus, and
    wherein the detection apparatus comprises:
    an image sensing device having an image sensing plane including a first periodic structure; and an optical system configured to illuminate a detection target on the substrate, including a second periodic structure different from the first periodic structure, and form an image of light from the detection target on the image sensing plane, wherein light having entered the image sensing plane generates a plurality of diffracted light beams of different orders in accordance with the first periodic structure, and wherein a normal of the image sensing plane is tilted with respect to an optical axis of the optical system such that the optical axis is located between diffracted light beams of adjacent orders not less than a first order among the plurality of diffracted light beams, wherein the optical system includes an illumination optical system configured to illuminate the detection target, and an imaging optical system configured to form the image of light from the detection target on the image sensing plane, and wherein the normal of the image sensing plane is tilted with respect to an optical axis of the imaging optical system such that the optical axis of the imaging optical system is located between diffracted light beams of adjacent orders not less than the first order among the plurality of diffracted light beams.

* * * * *